US012559361B2

(12) United States Patent
Cao et al.

(10) Patent No.: US 12,559,361 B2
(45) Date of Patent: Feb. 24, 2026

(54) MEMS SWITCH DEVICE AND ELECTRONIC APPARATUS

(71) Applicant: BOE Technology Group Co., Ltd., Beijing (CN)

(72) Inventors: Zibo Cao, Beijing (CN); Yingli Shi, Beijing (CN); Jingwen Guo, Beijing (CN); Chunxin Li, Beijing (CN); Qianhong Wu, Beijing (CN); Jianyun Zhao, Beijing (CN); Jianxing Liu, Beijing (CN); Feng Qu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 396 days.

(21) Appl. No.: 18/024,565

(22) PCT Filed: Jun. 29, 2022

(86) PCT No.: PCT/CN2022/102441
§ 371 (c)(1),
(2) Date: Mar. 3, 2023

(87) PCT Pub. No.: WO2024/000294
PCT Pub. Date: Jan. 4, 2024

(65) Prior Publication Data
US 2024/0279050 A1 Aug. 22, 2024

(51) Int. Cl.
B81B 3/00 (2006.01)
B81C 1/00 (2006.01)

(52) U.S. Cl.
CPC ........ B81B 3/0072 (2013.01); B81C 1/00142 (2013.01); B81B 2201/018 (2013.01);
(Continued)

(58) Field of Classification Search
CPC ... H01H 59/0009; G06F 3/041; B81B 3/0072; B81B 2201/018; B81B 2203/0109;
(Continued)

(56) References Cited

U.S. PATENT DOCUMENTS

| | | | | |
|---|---|---|---|---|
| 2007/0024401 A1* | 2/2007 | Kim | ................... | H01H 59/0009 |
| | | | | 333/262 |
| 2010/0141362 A1* | 6/2010 | Lee | ......................... | H01P 1/127 |
| | | | | 333/262 |
| 2016/0181040 A1* | 6/2016 | Robin | .................... | H01H 49/00 |
| | | | | 29/622 |

FOREIGN PATENT DOCUMENTS

| | | |
|---|---|---|
| CN | 2752935 Y | 1/2006 |
| CN | 201518299 U | 6/2010 |

(Continued)

*Primary Examiner* — Moazzam Hossain
(74) *Attorney, Agent, or Firm* — Nath, Goldberg & Meyer; Joshua B. Goldberg

(57) ABSTRACT

The present disclosure provides an MEMS switch device and an electronic apparatus. The MEMS switch device includes a base substrate, a membrane bridge structure, and a first ground line, a signal line and a second ground line sequentially arranged on a first side surface of the base substrate at intervals; the membrane bridge structure has a first end electrically connected to the first ground line, and a second end, opposite to the first end, electrically connected to the second ground line; and the membrane bridge structure includes a membrane bridge body structure and at least one protruding structure on the membrane bridge body structure, where the protruding structure protrudes from the membrane bridge body structure in a direction perpendicular to the first side surface of the base substrate.

20 Claims, 7 Drawing Sheets

(52) U.S. Cl.
CPC ................. *B81B 2203/0109* (2013.01); *B81B 2203/0127* (2013.01); *B81B 2203/04* (2013.01); *B81B 2203/053* (2013.01)

(58) Field of Classification Search
CPC ........ B81B 2203/0127; B81B 2203/04; B81B 2203/053; B81C 1/00142
See application file for complete search history.

(56)                     References Cited

FOREIGN PATENT DOCUMENTS

| | | | |
|---|---|---|---|
| CN | 101777461 | A | 7/2010 |
| CN | 103547335 | A | 1/2014 |
| CN | 103547335 | B | 5/2016 |
| CN | 113321177 | A | 8/2021 |
| CN | 114497929 | A | 5/2022 |
| JP | H08293645 | A | 11/1996 |
| WO | 2014146264 | A1 | 9/2014 |

* cited by examiner

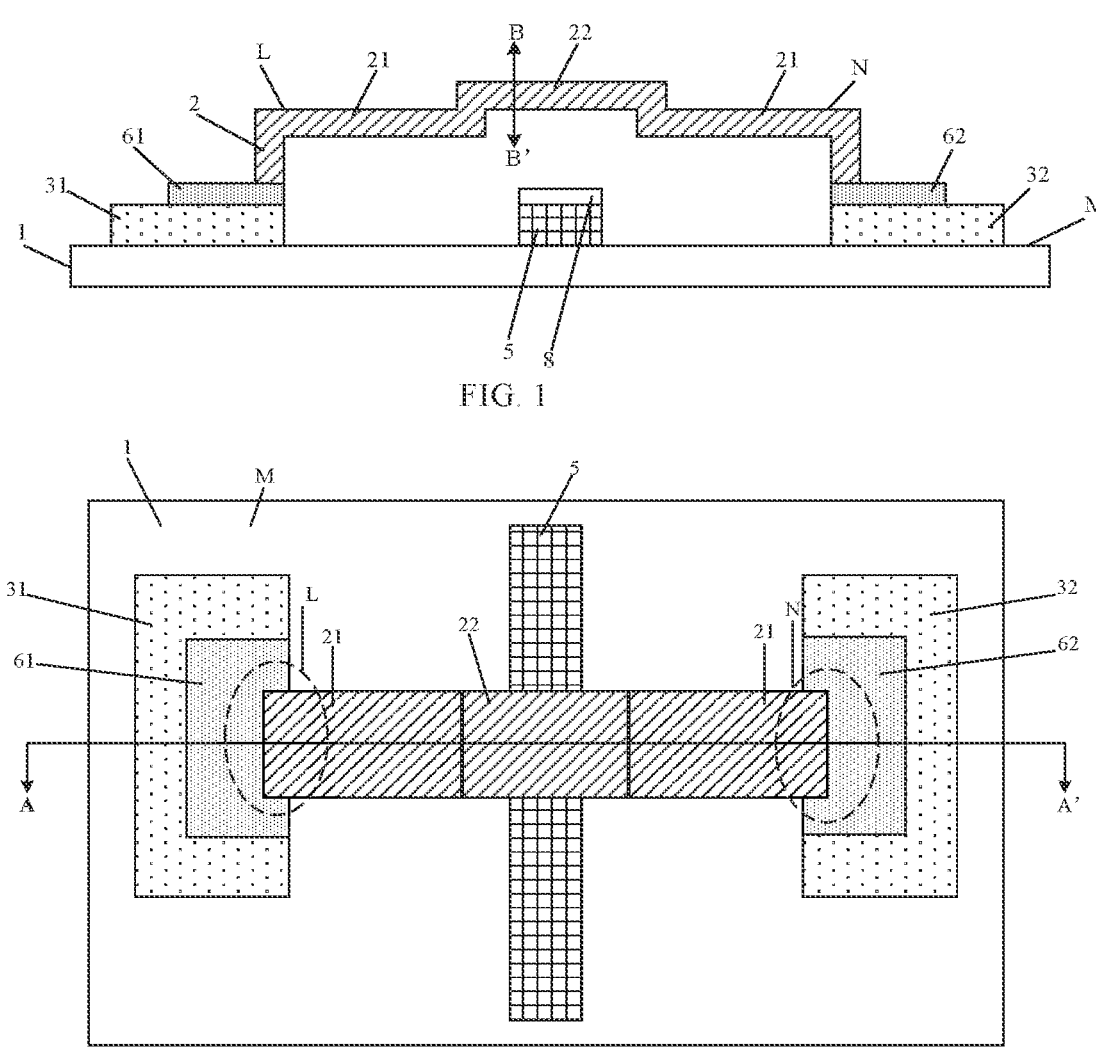
FIG. 1
FIG. 2
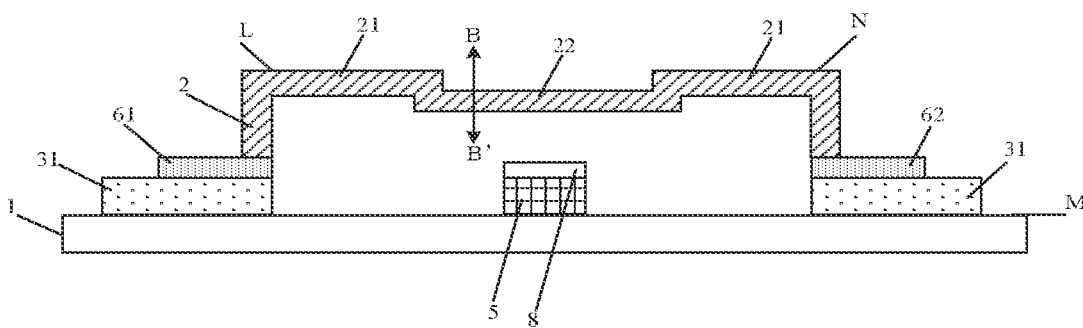
FIG. 3

MEMS SWITCH DEVICE AND ELECTRONIC APPARATUS

This is a National Phase Application filed under 35 U.S.C. 371 as a national stage of PCT/CN2022/102441, filed Jun. 29, 2022, the content of which is hereby incorporated by reference in its entirety.

TECHNICAL FIELD

The present disclosure relates to the field of switch devices, and in particular relates to an MEMS switch device and an electronic apparatus.

BACKGROUND

A micro electro mechanical system (MEMS) switch device refers to a device using an MEMS, and with continuous development of the MEMS technology, MEMS switches are widely used in the fields of radio frequency, circuits, display, and the like.

SUMMARY

Embodiments of the present disclosure provide an MEMS switch device and an electronic apparatus.

According to a first aspect of the present disclosure, the present disclosure provides an MEMS switch device, including: a base substrate, a membrane bridge structure, and a first ground line, a signal line, a second driving electrode and a second ground line, wherein the first ground line, the signal line and the second ground line are sequentially arranged on a first side surface of the base substrate at intervals; wherein the membrane bridge structure has a first end electrically connected to the first ground line, and a second end, opposite to the first end, electrically connected to the second ground line; and the membrane bridge structure includes a membrane bridge body structure and at least one protruding structure on the membrane bridge body structure, wherein the protruding structure protrudes from the membrane bridge body structure in a direction perpendicular to the first side surface of the base substrate.

In some embodiments, the protruding structure protrudes from the membrane bridge body structure in a direction perpendicular to and away from the first side surface of the base substrate.

In some embodiments, the protruding structure protrudes from the membrane bridge body structure in a direction perpendicular and close to the first side surface of the base substrate, and a side surface of the protruding structure facing away from the base substrate is not in a same horizontal plane as a side surface of the membrane bridge body structure facing away from the base substrate.

In some embodiments, one protruding structure is provided.

In some embodiments, the membrane bridge body structure includes a first membrane bridge body structure and a second membrane bridge body structure sequentially arranged in a direction parallel to the first side surface of the base substrate, the protruding structure is disposed between the first membrane bridge body structure and the second membrane bridge body structure, with one end of the protruding structure connected to the first membrane bridge body structure and the other end of the protruding structure connected to the second membrane bridge body structure.

In some embodiments, at least two protruding structures are provided and arranged at intervals, and the membrane bridge body structure and the protruding structures are sequentially and alternately arranged.

In some embodiments, a plurality of protruding structures are provided and arranged at equal intervals.

In some embodiments, two protruding structures are provided, and the membrane bridge body structure includes a first membrane bridge body structure, a second membrane bridge body structure, and a third membrane bridge body structure sequentially arranged in a direction parallel to the first side surface of the base substrate; and one of the two protruding structures is correspondingly disposed between the first membrane bridge body structure and the second membrane bridge body structure, while the other of the two protruding structures is correspondingly disposed between the second membrane bridge body structure and the third membrane bridge body structure.

In some embodiments, an orthographic projection of the protruding structure on the base substrate has any one or combination of a rectangular shape, a circular shape, a cross shape, or an irregular shape.

In some embodiments, a ratio of a thickness of the protruding structure to a thickness of the membrane bridge body structure ranges from 0.5 to 1000.

In some embodiments, a ratio of a length of the protruding structure to an overall length of the membrane bridge structure ranges from 0.5% to 50%.

In some embodiments, the protruding structure has a thickness in a range of 200 nm to 500 nm.

In some embodiments, the protruding structure has a length in a range of 15 μm to 40 μm.

In some embodiments, a distance between any two adjacent protruding structures ranges from 30 μm to 40 μm.

In some embodiments, at least one of the first end or the second end of the membrane bridge structure is provided as a hollowed-out structure.

In some embodiments, an orthographic projection of the hollowed-out structure on the base substrate has a concave or serpentine shape.

In some embodiments, the membrane bridge body structure is integrally formed with the protruding structure.

According to a second aspect of the present disclosure, the present disclosure provides an electronic apparatus, including the MEMS switch device as described above.

BRIEF DESCRIPTION OF DRAWINGS

FIG. 1 is a schematic structural diagram of an MEMS switch device according to an embodiment of the present disclosure;

FIG. 2 is a schematic top view of an MEMS switch device according to an embodiment of the present disclosure;

FIG. 3 is a schematic structural diagram of another MEMS switch device according to an embodiment of the present disclosure;

DETAIL DESCRIPTION OF EMBODIMENTS

Figure 4:
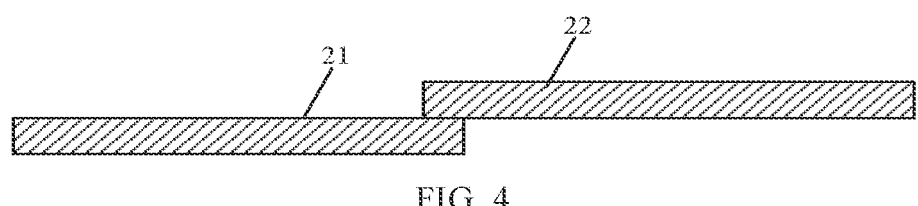
FIG. 4 is a schematic structural diagram of a membrane bridge structure.

In order to make those skilled in the art better understand the technical solutions in the embodiments of the present disclosure, the technical solutions of the MEMS switch device and the electronic apparatus provided in the embodiments of the present disclosure will be clearly and completely described below with reference to the drawings of the embodiments of the present disclosure.

Example embodiments will be described more sufficiently below with reference to the accompanying drawings, but which may be embodied in different forms and should not be construed as limited to the embodiments set forth herein. Rather, these embodiments are provided so that the present disclosure will be thorough and complete, and will fully convey the scope of the present disclosure to those skilled in the art.

The terminology used herein is for the purpose of describing specific embodiments only and is not intended to limit the present disclosure. As used herein, the singular forms "a", "an" and "the" are intended to include the plural forms as well, unless the context clearly indicates otherwise. It will be further understood that as used herein, the terms "comprise" and/or "include" specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements/structures, these elements/structures should not be limited by these terms. These terms are merely used to distinguish one element/structure from another element/structure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the existing art and the present disclosure, and will not be interpreted in an idealized or overly formal sense unless expressly so defined herein.

In the existing art, a membrane bridge surface of the MEMS bridge switch in the Z-axis direction is a horizontal plane, and under a stress action, the membrane bridge is easy to curl. In the case of severe curling, an actual distance between the membrane bridge and a capacitive electrode of the switch will be obviously reduced compared with a standard design distance, and even leads to adhesion of the membrane bridge and the capacitive electrode of the switch, causing failure of the switch and thereby influencing the product yield of the MEMS switch.

In view of this, an embodiment of the present disclosure provides an MEMS switch device. FIG. 1 is a schematic structural diagram of an MEMS switch device according to an embodiment of the present disclosure. FIG. 2 is a schematic top view of an MEMS switch device according to an embodiment of the present disclosure. FIG. 1 may be regarded as a schematic cross-sectional view of the MEMS switch device in FIG. 2 along the AA' direction. As shown in FIGS. 1 and 2, the MEMS switch device includes: a base substrate 1, a membrane bridge structure 2, a first ground line 31, a signal line 5 and a second ground line 32. The first ground line 31, the signal line 5 and the second ground line 32 are sequentially arranged on a first side surface M of the base substrate 1 at intervals. The membrane bridge structure 2 has a first end L electrically connected to the first ground line 31. The membrane bridge structure 2 has a second end N, opposite to the first end L, electrically connected to the second ground line 32.

The membrane bridge structure 2 includes a membrane bridge body structure 21 and at least one protruding structure 22 on the membrane bridge body structure 21. The protruding structure 22 protrudes from the membrane bridge body structure 21 in a direction BB' perpendicular to the first side surface M of the base substrate 1.

In the embodiments of the present disclosure, by providing the protruding structure protruding from the membrane bridge body structure in the direction perpendicular to the first side surface of the base substrate in the membrane bridge structure of the MEMS switch device, the protruding structure can effectively adjust stress distribution on a surface of the membrane bridge structure, so as to improve the curling effect of the membrane bridge structure due to stress and reduce the curling degree of the membrane bridge structure, so that the actual distance between the capacitive electrode of the membrane bridge structure and the MEMS switch device can be closer to the standard design distance, and an initial capacitance of the MEMS switch device can be improved, thereby increasing a change degree of the capacitance upon opening/closing of the MEMS switch device, and effectively improving the product yield of the MEMS switch device.

In an embodiment of the present disclosure, the protruding structure 22 protrudes from the membrane bridge body structure 21 in a direction BB' perpendicular to the first side surface M of the base substrate 1. That is, the protruding structure 22 protrudes from a side surface of the membrane bridge body structure 21 facing away from the base substrate 1, or the protruding structure 22 is recessed from the side surface of the membrane bridge body structure 21 facing away from the base substrate 1. In contrast, the membrane bridge body structure 21 protrudes from the protruding structure 22 in the direction BB' perpendicular to the first side surface M of the base substrate 1. That is, the membrane bridge body structure 212 protrudes or is recessed from a side surface of the protruding structure 22 facing the base substrate 1.

In some embodiments, as shown in FIG. 1, the protruding structure 22 protrudes from the membrane bridge body structure 21 in a direction B'B perpendicular to and away from the first side surface of the base substrate 1. That is, the protruding structure 22 protrudes from the side surface of the membrane bridge body structure 21 facing away from the base substrate 1.

It should be noted that FIG. 1 merely shows the case where the protruding structure 22 protrudes from the side surface of the membrane bridge body structure 21 facing away from the base substrate 1 as an example, which is included in, but does not form any limitation to, the embodiments of the present disclosure.

FIG. 3 is a schematic structural diagram of another MEMS switch device according to an embodiment of the present disclosure. As shown in FIG. 3, in some embodiments, the protruding structure 22 protrudes from the membrane bridge body structure 21 in a direction BB' perpendicular and adjacent to the first side surface M of the base substrate 1. That is, the protruding structure 22 is recessed from the side surface of the membrane bridge body structure 21 facing away from the base substrate 1.

In an embodiment of the present disclosure, as in two arrangement manners of the protruding structures 22 shown in FIGS. 1 and 3, a surface of the membrane bridge body structure 21 in the direction BB' perpendicular to the first side surface M of the base substrate 1 is not in a same horizontal plane as a surface of the protruding structure 22 in the direction BB' perpendicular to the first side surface M of the base substrate 1.

In some embodiments, the protruding structure 22 protrudes from the side surface of the membrane bridge body structure 21 facing away from the base substrate 1. A side surface (upper surface) of the membrane bridge body structure 21 facing away from the base substrate 1 in the direction BB' perpendicular to the first side surface of the base substrate 1 is not in a same horizontal plane as a side surface (upper surface) of the protruding structure 22 facing away from the base substrate 1 in the direction BB' perpendicular to the first side surface of the base substrate 1. In this case, optionally, a side surface (lower surface) of the membrane bridge body structure 21 facing the base substrate 1 in the direction BB' perpendicular to the first side surface of the base substrate 1 may be in a same horizontal plane as, or in a different horizontal plane from, a side surface (lower surface) of the protruding structure 22 facing the base substrate 1 in the direction BB' perpendicular to the first side surface of the base substrate 1.

In some embodiments, the protruding structure 22 is recessed from the side surface of the membrane bridge body structure 21 facing away from the base substrate 1. A side surface (lower surface) of the membrane bridge body structure 21 facing the base substrate 1 in the direction BB' perpendicular to the first side surface M of the base substrate 1 is not in a same horizontal plane as a side surface (lower surface) of the protruding structure 22 facing the base substrate 1 in the direction B'B perpendicular to the first side surface of the base substrate 1. In this case, optionally, a side surface (upper surface) of the membrane bridge body structure 21 facing away from the base substrate 1 in the direction BB' perpendicular to the first side surface of the base substrate 1 is not in a same horizontal plane as a side surface (upper surface) of the protruding structure 22 facing away from the base substrate 1 in the direction BB' perpendicular to the first side surface of the base substrate 1.

In an embodiment of the present disclosure, one or more protruding structures 22, and also one or more membrane bridge body structures 21, may be provided.

In an embodiment of the present disclosure, the protruding structures 22 may be distributed at any position on the membrane bridge body structure 21.

In some embodiments, the membrane bridge body structures 21 and the protruding structures 22 may be sequentially and alternately arranged in series in an extending direction of the membrane bridge structure 2. The extending direction of the membrane bridge structure 2 is a direction parallel to the first side surface M of the base substrate 1 and perpendicular to a side surface of the first ground line 31 facing the second ground line 32.

Figure 5:
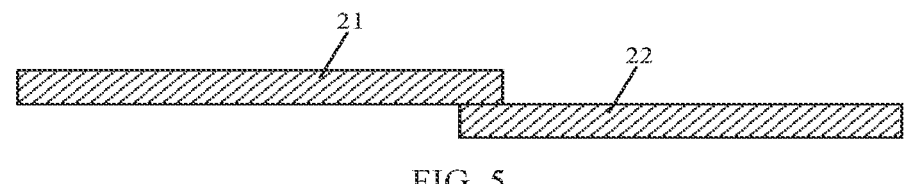
FIG. 5 is a schematic structural diagram of another membrane bridge structure.

FIG. 4 is a schematic structural diagram of a membrane bridge structure, and FIG. 5 is a schematic structural diagram of another membrane bridge structure. Exemplarily, as shown in FIGS. 4 and 5, one protruding structure 22, and also one membrane bridge body structure 21, are provided. The protruding structure 22 may be disposed at one end of the membrane bridge body structure 21 along the extending direction of the membrane bridge structure 2, and one end of the protruding structure 22 is connected to the one end of the membrane bridge body structure 21.

Exemplarily, as shown in FIGS. 1 and 3, one protruding structure 22 is provided, and two membrane bridge body structures 21 are provided. The two membrane bridge body structures 21 are a first membrane bridge body structure (the left membrane bridge body structure 21 as shown) and a second membrane bridge body structure (the right membrane bridge body structure 21 as shown) sequentially arranged in a direction parallel to the first side surface M of the base substrate 1. The protruding structure 22 is correspondingly disposed between the first membrane bridge body structure and the second membrane bridge body structure. One end of the protruding structure 22 is connected to one end of the first membrane bridge body structure, and the other end of the protruding structure 22 is connected to one end of the second membrane bridge body structure. In some embodiments, the protruding structure 22 is disposed at a central position of the overall membrane bridge structure 2. In other words, the first membrane bridge body structure and the second membrane bridge body structure has a same length along the extending direction of the membrane bridge structure 2.

In some embodiments, at least two protruding structures 22 are provided and arranged at intervals, and the membrane bridge body structure 21 and the protruding structures 22 are sequentially and alternately arranged in series.

Figure 6:
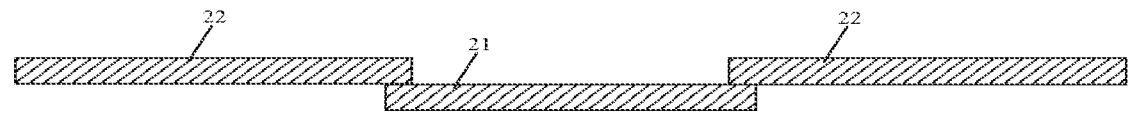
FIG. 6 is a schematic structural diagram of another membrane bridge structure.

FIG. 6 is a schematic structural diagram of another membrane bridge structure. Exemplarily, as shown in FIG. 6, two protruding structures 22 are provided and disposed at two ends of the membrane bridge body structure 21 along the extending direction of the membrane bridge structure 2. That is, the membrane bridge body structure 21 has one end connected to one of the protruding structures 22, and the other end connected to the other protruding structure 22.

Figure 7:
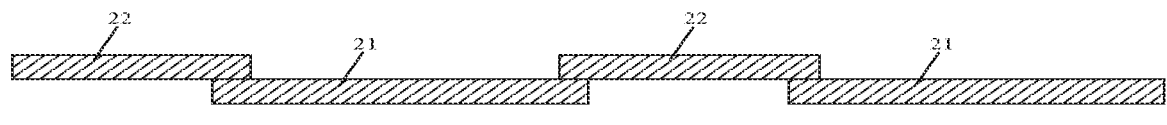
FIG. 7 is a schematic structural diagram of another membrane bridge structure.

FIG. 7 is a schematic structural diagram of another membrane bridge structure. Exemplarily, as shown in FIG. 7, two protruding structures 22 are provided, and two membrane bridge body structures 21 are provided, and the protruding structures 22 and the membrane bridge body structures 21 are sequentially and alternately arranged in series.

Figure 8:
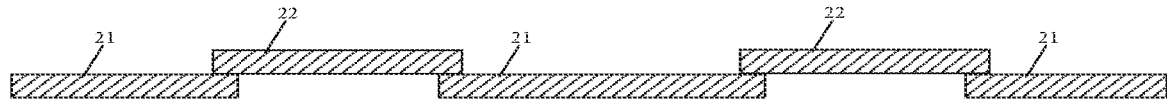
FIG. 8 is a schematic structural diagram of another membrane bridge structure.
Figure 9:
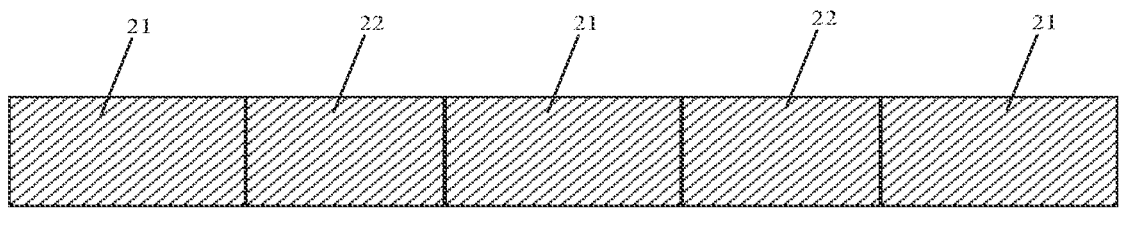
FIG. 9 is a schematic top view of the membrane bridge structure in FIG. 8.

FIG. 8 is a schematic structural diagram of another membrane bridge structure, and FIG. 9 is a schematic top view of the membrane bridge structure in FIG. 8. As shown in FIGS. 8 and 9, the protruding structure 22 protrudes from the membrane bridge body structure 21 in a direction perpendicular to and away from the first side surface M of the base substrate 1. Two protruding structures 22 are provided, and three membrane bridge body structures 21 are provided. The three membrane bridge body structures 21 comprise a first membrane bridge body structure (the left membrane bridge body structure 21 as shown), a second membrane bridge body structure (the middle membrane bridge body structure 21 as shown), and a third membrane bridge body structure (the right membrane bridge body structure 21 as shown) sequentially arranged in a direction parallel to the first side surface M of the base substrate 1. One of the two protruding structures 22 is correspondingly disposed between the first membrane bridge body structure and the second membrane bridge body structure, while the other of the two protruding structures 22 is correspondingly disposed between the second membrane bridge body structure and the third membrane bridge body structure. One of the protruding structures 22 has one end connected to one end of the first membrane bridge body structure, and the other end connected to one end of the second membrane bridge body structure. The other protruding structure 22 has one end connected to the other end of the second membrane bridge body structure, and the other end connected to one end of the third membrane bridge body structure.

Figure 10:
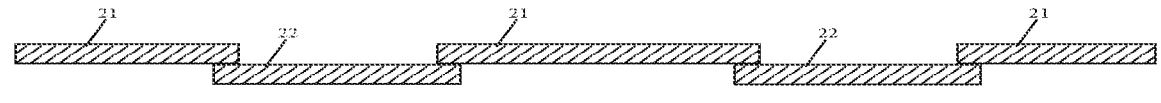
FIG. 10 is a schematic structural diagram of another membrane bridge structure.

FIG. 8 shows the protruding structures 22 protruding from a side surface of the membrane bridge body structure 21 facing away from the base substrate 1, which is included in, but does not form any limitation to, the embodiments of the present disclosure. FIG. 10 is a schematic structural diagram of another membrane bridge structure. As shown in FIG. 10, in some embodiments, the protruding structure 22 protrudes from the membrane bridge body structure 21 in a direction perpendicular and adjacent to the first side surface M of the base substrate 1. Two protruding structures 22 are provided, and three membrane bridge body structures 21 are provided. The three membrane bridge body structures 21 comprise a first membrane bridge body structure (the left membrane bridge body structure 21 as shown), a second membrane bridge body structure (the middle membrane bridge body structure 21 as shown), and a third membrane bridge body structure (the right membrane bridge body structure 21 as shown) sequentially arranged in a direction parallel to the first side surface M of the base substrate 1. One of the two protruding structures 22 is correspondingly disposed between the first membrane bridge body structure and the second membrane bridge body structure, while the other of the two protruding structures 22 is correspondingly disposed between the second membrane bridge body structure and the third membrane bridge body structure. One of the protruding structures 22 has one end connected to one end of the first membrane bridge body structure, and the other end connected to one end of the second membrane bridge body structure. The other protruding structure 22 has one end connected to the other end of the second membrane bridge body structure, and the other end connected to one end of the third membrane bridge body structure.

It should be noted that the positional relationship of the protruding structure 22 and the membrane bridge body structure 21 in the embodiments of the present disclosure is not limited to the above-mentioned case where protruding structures 22 and membrane bridge body structure 21 are sequentially and alternately arranged in series. In an embodiment of the present disclosure, at least one protruding structure 22 may be distributed at any position or area on the membrane bridge body structure 21.

Figure 11:
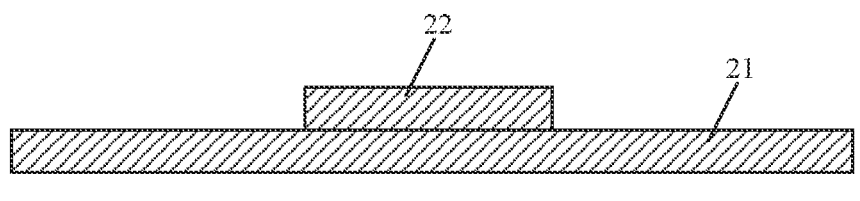
FIG. 11 is a schematic structural diagram of another membrane bridge structure.

FIG. 11 is a schematic structural diagram of another membrane bridge structure. As shown in FIG. 11, in some embodiments, the protruding structure 22 is disposed on, and protrudes from, a side surface of the membrane bridge body structure 21 facing away from the base substrate 1.

In an embodiment of the present disclosure, an orthographic projection of the protruding structure 22 on the base substrate 1 has any one or combination of a rectangular shape, a circular shape, a cross shape, or an irregular shape. The orthographic projection of the protruding structure 22 on the base substrate 1 refers to a projection of the protruding structure 22 in a direction perpendicular to a side surface of the base substrate 1. Exemplarily, as shown in FIG. 2 or 9, the orthographic projection of the protruding structure 22 on the base substrate 1 has a rectangular shape.

It should be noted that the orthographic projection of the protruding structure 22 on the base substrate 1 may be set to any other appropriate shape according to the actual situation, which is not particularly limited in the embodiments of the present disclosure.

Figure 12:
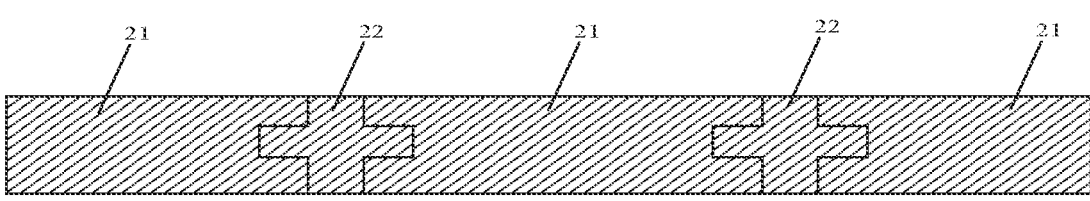
FIG. 12 is a schematic diagram illustrating a shape of an orthographic projection of a protruding structure.

FIG. 12 is a schematic diagram illustrating a shape of an orthographic projection of a protruding structure. As shown in FIG. 12, in some embodiments, the orthographic projection of the protruding structure 22 on the base substrate 1 has a cross shape. The protruding structure 22 may protrude, or be recessed, from the side surface of the membrane bridge body structure 21 facing away from the base substrate 1.

In some embodiments, a ratio of a thickness of the protruding structure 22 to a thickness of the membrane bridge body structure 21 may be set to range from 0.5 to 1000. Here, "thickness" refers to a length in a direction perpendicular to the first side surface M of the base substrate 1.

In some embodiments, the thickness of the membrane bridge body structure 21 may be set in a range of 200 nm to 300 nm. Accordingly, the thickness of the protruding structure 22 may be set in a range of 200 nm to 500 nm. In some embodiments, the thickness of the membrane bridge body structure 21 may be set to 0.4 μm, and the thickness of the protruding structure 22 may be set to 0.25 μm.

In some embodiments, a ratio of a length of the protruding structure 22 to an overall length of the membrane bridge structure 2 may be set to range from 0.5% to 50%. Here, "length" refers to a length in the extending direction of the membrane bridge structure 2.

In some embodiments, the overall length of the membrane bridge structure 2 may be set in the range of 100 μm to 120 μm. Accordingly, the length of the protruding structure 22 may be set in a range of 15 μm to 40 μm.

In some embodiments, the overall length of the membrane bridge body structure 21 may be set to 120 μm, and the length of the protruding structure 22 may be set to 40 μm. Such arrangement may be applied to the case of one protruding structure 22.

In some embodiments, the overall length of the membrane bridge body structure 21 may be set to 120 μm, and the length of the protruding structure 22 may be set to 15 μm. Such arrangement may be applied to the case of two protruding structures 22 protruding from the membrane bridge body structure 21.

In some embodiments, the overall length of the membrane bridge body structure 21 may be set to 100 μm, and the length of the protruding structure 22 may be set to 30 μm. Such arrangement may be applied to the case of two protruding structures 22 recessed from the side surface of the membrane bridge body structure 21 facing away from the base substrate 1.

In some embodiments, in the case where a plurality of (at least three) protruding structures 22 are provided and arranged at intervals, the plurality of protruding structures are disposed at equal intervals. That is, a same distance is provided between every two adjacent protruding structures 22.

In some embodiments, in the case where at least two protruding structures 22 are provided and arranged at intervals, a distance between any two adjacent protruding structures 22 may be set to range from 30 μm to 40 μm.

In some embodiments, in the case where at least two protruding structures 22 are provided and arranged at intervals, the distance between any two adjacent protruding structures 22 may be set to 40 μm.

In some embodiments, the protruding structure 22 has a same width as the membrane bridge body structure 21. Here, "width" refers to a width in a direction parallel to the first side surface M of the base substrate 1 and perpendicular to the extending direction of the membrane bridge structure 2.

Figure 13:
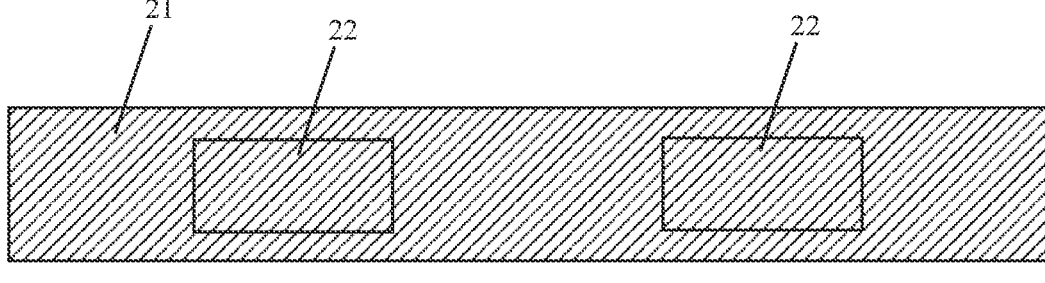
FIG. 13 is a top view of another membrane bridge structure.

In some embodiments, the width of the protruding structure 22 may be set to be smaller than the width of the membrane bridge body structure 21. FIG. 13 is a top view of another membrane bridge structure. Exemplarily, as shown in FIG. 13, in the membrane bridge structure 2, the membrane bridge body structure 21 is provided with at least one specific region in which the protruding structure 22 is correspondingly provided. In this case, the width of the protruding structure 22 may be smaller than the width of the membrane bridge body structure 21.

It should be noted that sizes of the membrane bridge structure 2, the membrane bridge body structure 21, and the protruding structure 22 are not particularly limited in the embodiments of the present disclosure, and may be set according to actual situations.

In an actual stress simulation test, the membrane bridge structure 2 according to the embodiment of the disclosure has a maximum deformation less than 0.1 μm under the stress action, and the curling degree is obviously improved compared with the existing art.

In an actual electrical property simulation test, by providing the protruding structure 22 recessed from the side surface of the membrane bridge body structure 21 facing away from the base substrate 1, partial structural height of the membrane bridge structure 2 is reduced, so that turning on the switch by pulling down under the effect of a lower driving voltage (e.g., 5V) can be realized, that is, the driving voltage of the switch is effectively reduced.

In some embodiments, a first end L and a second end N of the membrane bridge structure 2 are each electrically connected to a corresponding ground line through a corresponding metal anchor. Exemplarily, as shown in FIG. 1, the first end L of the membrane bridge structure 2 is electrically connected to a corresponding first ground line 31 through a first metal anchor 61 on a side of the first ground line 31 away from the base substrate 1, and the second end N of the membrane bridge structure 2 is electrically connected to a corresponding second ground line 32 through a second metal anchor 62 on a side of the second ground line 32 away from the base substrate 1.

In some embodiments, at least one of the first end L or the second end N of the membrane bridge structure 2 is provided as a hollowed-out structure. An orthographic projection of the hollowed-out structure on the base substrate 1 may have a concave shape, a serpentine shape, or any other zigzag shape.

By providing at least one end of the membrane bridge structure 2 as a hollowed-out structure, the width of the membrane bridge structure 2 can be reduced at the metal anchor for connection of the end, thereby effectively reducing the spring coefficient of the MEMS switch device and thus the driving voltage of the MEMS switch device.

Figure 14:
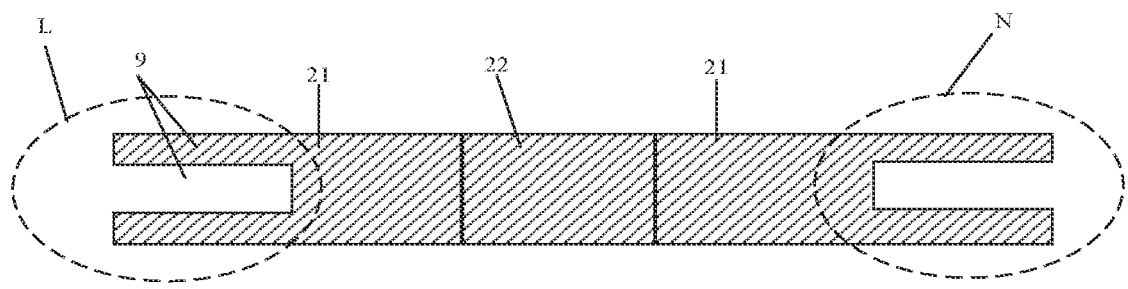
FIG. 14 is a schematic structural diagram of another membrane bridge structure.

FIG. 14 is a schematic structural diagram of another membrane bridge structure. As shown in FIGS. 2 and 14, in some embodiments, the first end L and the second end N of the membrane bridge structure 2 are respectively configured as a hollowed-out structure 9 in a concave shape.

Figure 15:
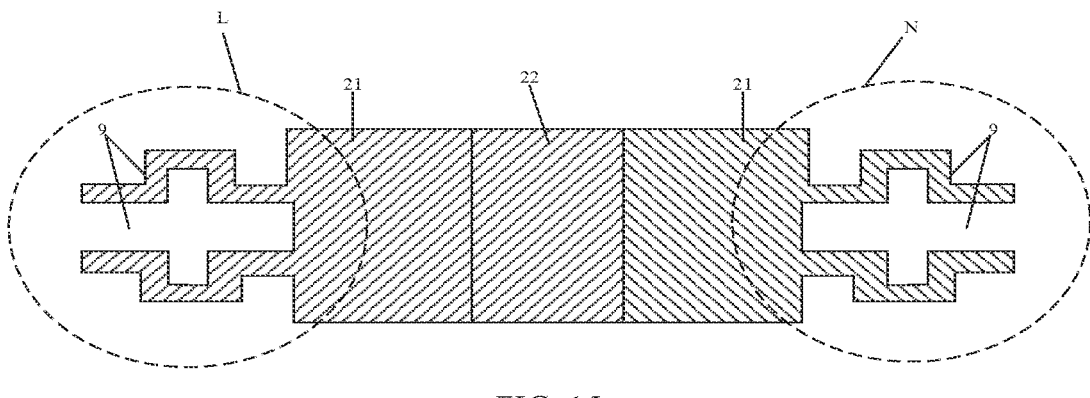
FIG. 15 is a schematic structural diagram of another membrane bridge structure.

FIG. 15 is a schematic structural diagram of another membrane bridge structure. As shown in FIGS. 2 and 15, in some embodiments, the first end L and the second end N of the membrane bridge structure 2 are respectively configured as a hollowed-out structure 9 in a serpentine shape.

In some embodiments, the membrane bridge body structure 21 is integrally formed with the protruding structure 22. In other words, the membrane bridge body structure 21 and the protruding structure 22 are made of a same material and formed through a same patterning process. In some embodiments, as shown in FIG. 11, the protruding structure 22 and the membrane bridge body structure 21 may be disposed in a stack. That is, the protruding structure 22 may be stacked on a side surface of the membrane bridge body structure 21 facing away from the base substrate 1.

In some embodiments, a dielectric layer and a capacitor upper plate 8 are sequentially disposed on a side of the signal line 5 away from the base substrate 1, and the dielectric layer is disposed between the signal line 5 and the capacitor upper plate 8, and the capacitor upper plate 8 forms a coupling capacitor with the dielectric layer and the signal line 5.

In an embodiment of the present disclosure, the first ground line 31 and the second ground line 32 are both ground structures (GND). The signal line 5 forms a coplanar waveguide (CPW) structure together with the first ground line 31 and the second ground line 32.

In some embodiments, the MEMS switch device is operated by applying a driving voltage on the signal line 5.

Figure 16:
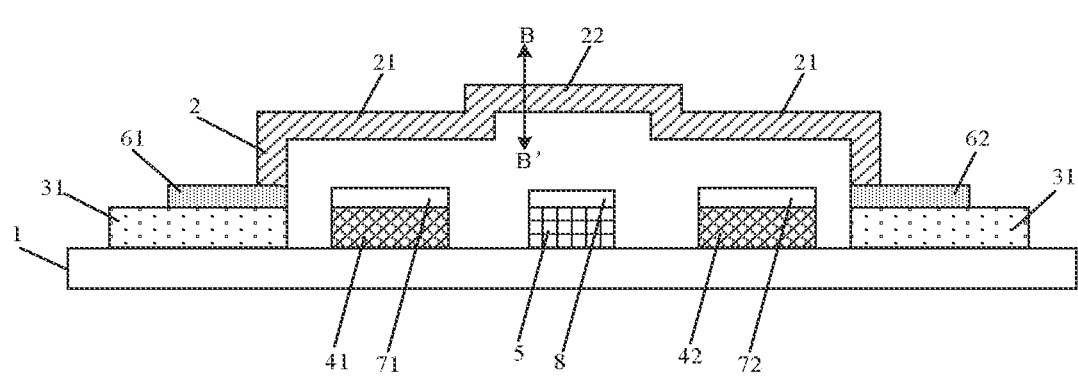
FIG. 16 is a schematic structural diagram of another MEMS switch device according to an embodiment of the present disclosure.
Figure 17:
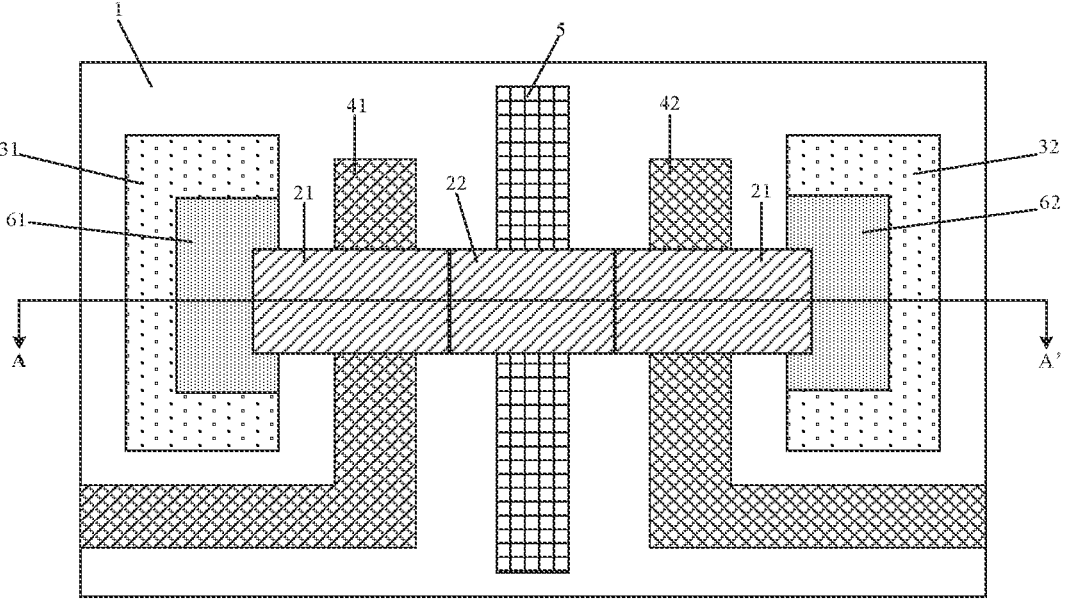
FIG. 17 is a schematic top view of the MEMS switch device in FIG. 16.

FIG. 16 is a schematic structural diagram of another MEMS switch device according to an embodiment of the present disclosure, and FIG. 17 is a schematic top view of the MEMS switch device in FIG. 16. As shown in FIGS. 16 and 17, in some embodiments, the MEMS switch device is operated by applying a driving voltage on a driving electrode, and the MEMS switch device may further include a first driving electrode 41 and a second driving electrode 42. The first driving electrode 41 is disposed between the first ground line 31 and the signal line 5, and the second driving electrode 42 is disposed between the signal line 5 and the second ground line 32. In other words, the first ground line 31, the first driving electrode 41, the signal line 5, the second driving electrode 42, and the second ground line 32 are sequentially arranged at intervals on a side surface of the base substrate.

In some embodiments, as shown in FIG. 16, a first isolation layer 71 is provided on a side of the first driving electrode 41 away from the base substrate 1, and a second isolation layer 72 is provided on a side of the second driving electrode 42 away from the base substrate 1, so as to prevent a short circuit condition.

In an embodiment of the present disclosure, the MEMS switch device is a capacitive MEMS switch device, and the operating principle of the MEMS switch device is as follows: as shown in FIG. 1 or 16, under an action of the driving voltage applied on the signal line 5 or the driving electrodes (41, 42), the membrane bridge structure 2 approaches or contacts the capacitor upper plate 8, and when the driving voltage is not applied, the membrane bridge structure 2 is far away from and out of contact with the capacitor upper plate 8, thereby turning on or off the switch.

Figure 18:
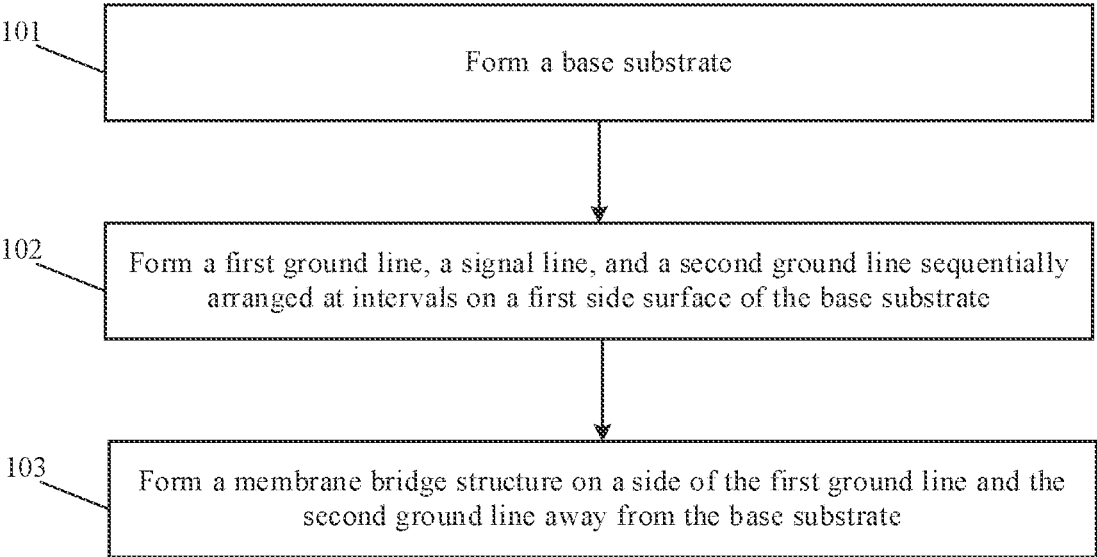
FIG. 18 is a schematic flowchart of a method for preparing an MEMS switch device according to an embodiment of the present disclosure.

FIG. 18 is a schematic flowchart of a method for preparing an MEMS switch device according to an embodiment of the present disclosure. As shown in FIG. 18, an embodiment of the present disclosure provides a method for preparing an MEMS switch device, which includes the following steps S101 to S103.

At step S101, forming a base substrate.

At step S102, forming a first ground line, a signal line, and a second ground line sequentially arranged at intervals on a first side surface of the base substrate.

At step S103, forming a membrane bridge structure on a side of the first ground line and the second ground line away from the base substrate.

Two opposite ends (a first end and a second end) of the membrane bridge structure are respectively and electrically connected to the first ground line and the second ground line. The membrane bridge structure includes a membrane bridge body structure, and at least one protruding structure in series with the membrane bridge body structure. The protruding structure protrudes from the membrane bridge body structure in a direction perpendicular to the first side surface of the base substrate.

Figure 19:
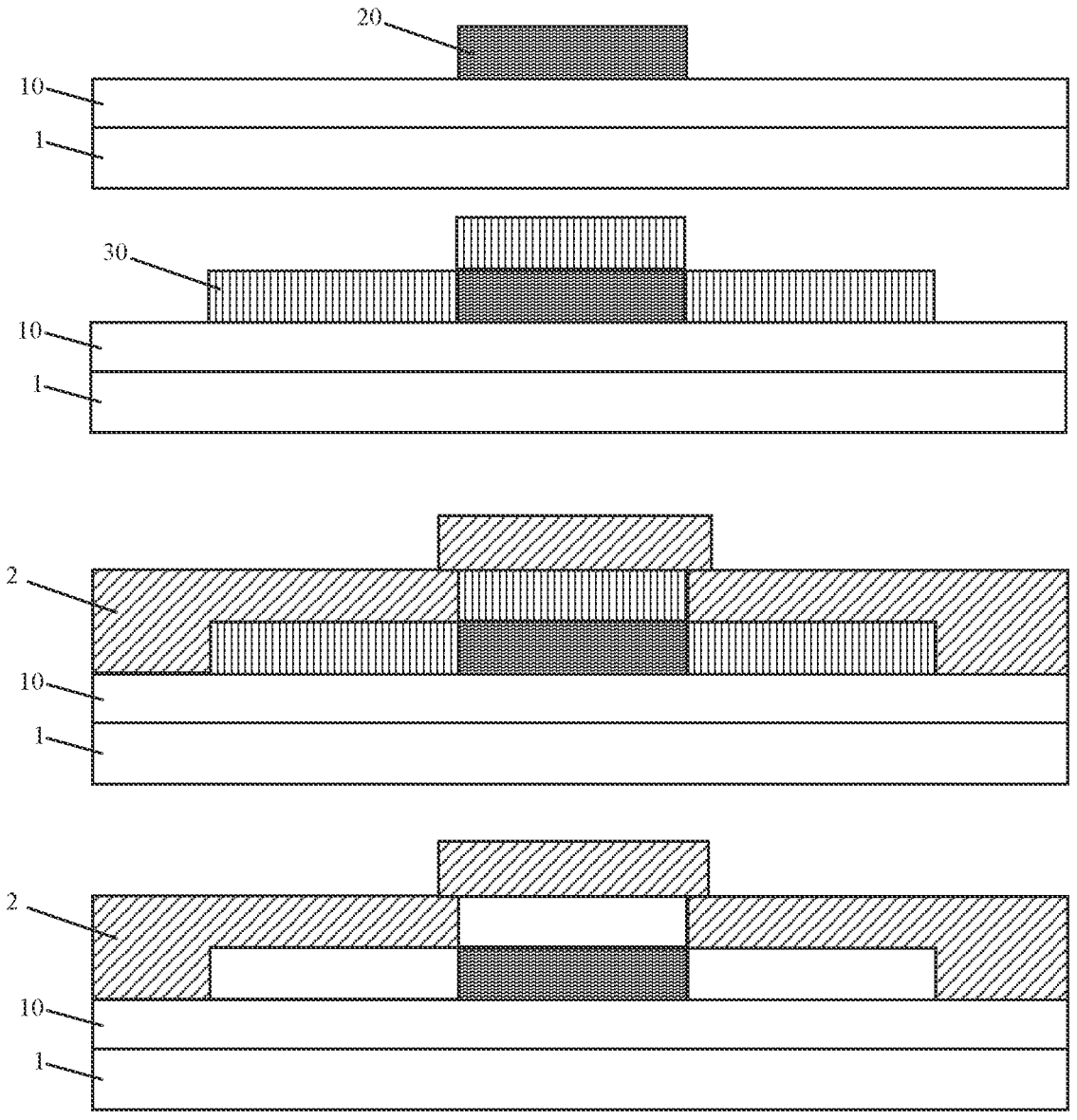
FIG. 19 is a process flowchart for forming a membrane bridge structure.

FIG. 19 is a process flowchart for forming a membrane bridge structure. As shown in FIG. 19, in some embodiments, an underlying structure 10 of the MEMS switch device is formed on the base substrate 1. The underlying structure 10 includes, but is not limited to, a first ground line, a first driving electrode, a signal line, a second driving electrode, and a second ground line.

A conformal structure layer 20 is formed after formation of the underlying structure 10. The conformal structure layer 20 may be made of an inorganic material, such as silicon nitride (SiN$_x$), silicon dioxide (SiO$_2$), or the like. Alternatively, the conformal structure layer 20 may be made of an organic material, such as a photosensitive resin, polyimide (PI), or the like. The material for the conformal structure layer 20 is subjected to patterning processes such as exposure, etching, patterning and the like to form the conformal structure layer 20.

A sacrificial layer 30 is formed after formation of the conformal structure layer 20. The sacrificial layer is made of an organic material, such as a photoresist or the like, and the sacrificial layer 30 has a configuration and a shape matched with the membrane bridge structure to be prepared.

Then, a material for the membrane bridge structure is deposited, where the material for the membrane bridge structure may be a metal material or a conductive non-metal material. The metal material may be a low-resistance metal material such as gold (Au), silver (Ag), copper (Cu), aluminum (Al) or the like, and the conductive non-metal material may be a low-resistance conductive non-metal material such as low-resistance silicon or the like. The material for the membrane bridge structure is subjected to patterning processes such as exposure, etching, patterning and the like to form the membrane bridge structure 2.

Thereafter, the sacrificial layer 30 is removed through a wet or dry process to obtain the desired membrane bridge structure 2.

Figure 20:
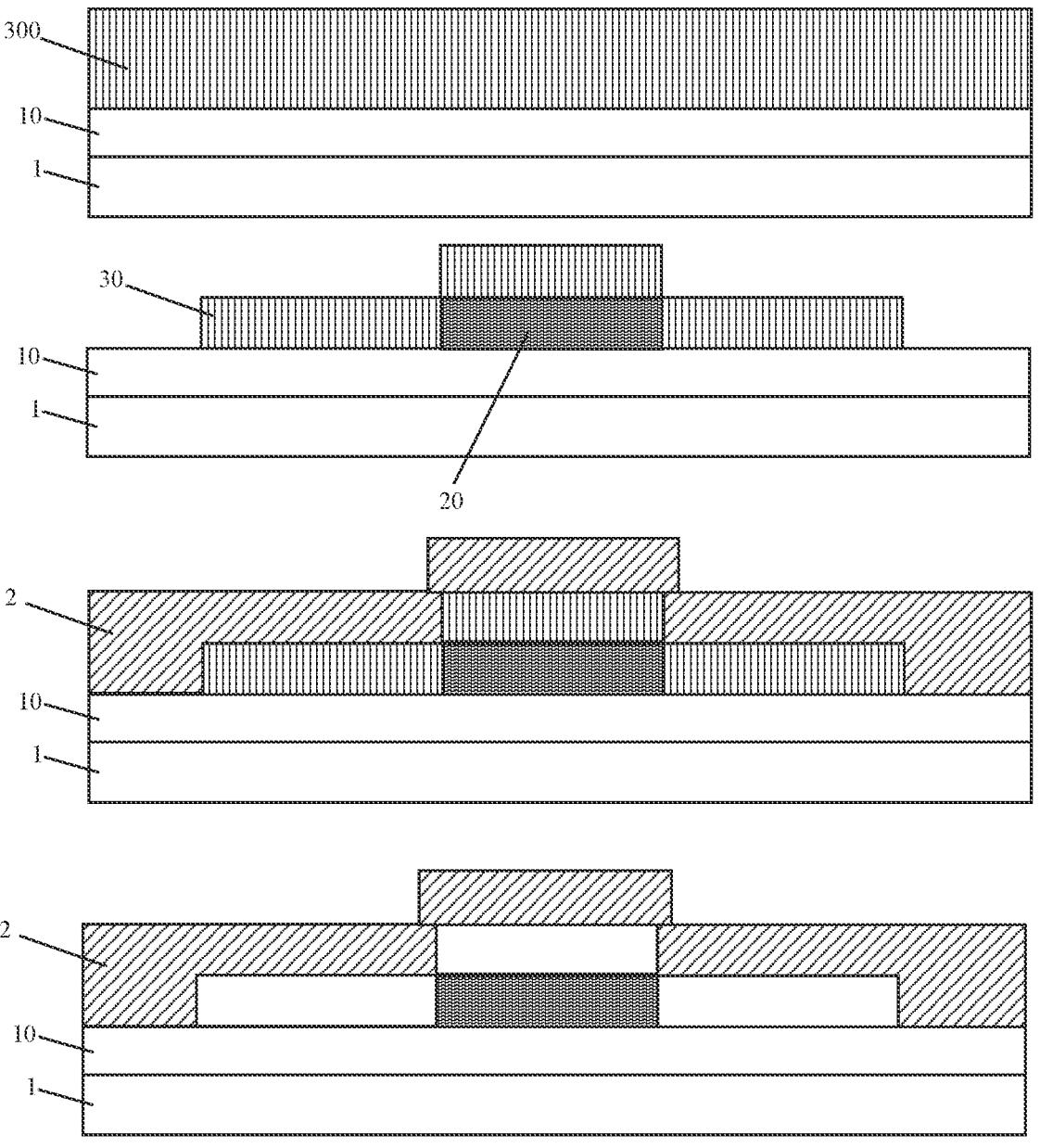
FIG. 20 is another process flowchart for forming a membrane bridge structure.

FIG. 20 is another process flowchart for forming a membrane bridge structure. As shown in FIG. 20, in some embodiments, an underlying structure 10 of the MEMS switch device is formed on the base substrate 1. The underlying structure 10 includes, but is not limited to, a first ground line, a first driving electrode, a signal line, a second driving electrode, and a second ground line.

A sacrificial material layer 300 is formed after formation of the underlying structure 10. The sacrificial material layer 300 may be made of an inorganic material, such as silicon nitride (SiN$_x$), silicon dioxide (SiO$_2$), or the like. Alternatively, the sacrificial material layer 300 may be made of an organic material, such as a photosensitive resin, polyimide (PI), or the like.

Then, the material for the sacrificial material layer 300 is subjected to patterning processes such as exposure, etching, patterning and the like to form a sacrificial layer 30 and a conformal structure layer 20. The sacrificial layer 30 has a configuration and a shape matched with the membrane bridge structure to be prepared.

Then, a material for the membrane bridge structure is deposited, where the material for the membrane bridge structure may be a metal material or a conductive non-metal material The metal material may be a low-resistance metal material such as gold (Au), silver (Ag), copper (Cu), aluminum (Al) or the like, and the conductive non-metal material may be a low-resistance conductive non-metal material such as low-resistance silicon or the like. The material for the membrane bridge structure is subjected to patterning processes such as exposure, etching, patterning and the like to form the membrane bridge structure 2.

Thereafter, the sacrificial layer 30 is removed through a wet or dry process to obtain the desired membrane bridge structure 2.

An embodiment of the present disclosure further provides an electronic apparatus, including the MEMS switch device according to any of the above embodiments.

In some embodiments, the electronic apparatus may be a display device, or may be an integrated circuit, a radio frequency device, a communication device, or the like. The display device may be a mobile phone, a tablet computer, a laptop, a desktop computer, a television, a vehicle-mounted terminal, or any other display device.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A micro electro mechanical system (MEMS) switch device, comprising: a base substrate, a membrane bridge structure, a first ground line, a signal line and a second ground line, wherein the first ground line, the signal line and the second ground line are sequentially arranged on a first side surface of the base substrate at intervals;

wherein the membrane bridge structure has a first end electrically connected to the first ground line, and a second end, opposite to the first end, electrically connected to the second ground line; and the membrane bridge structure comprises a membrane bridge body structure and at least one protruding structure on the membrane bridge body structure, wherein the protruding structure protrudes from the membrane bridge body structure in a direction perpendicular to the first side surface of the base substrate, wherein one end of the protruding structure connects to one end of the membrane bridge body structure, and an orthographic projection of the protruding structure on the base substrate partially overlaps an orthographic projection of the membrane bridge body structure on the base substrate.

2. The MEMS switch device according to claim 1, wherein the protruding structure protrudes from the membrane bridge body structure in a direction perpendicular to and away from the first side surface of the base substrate.

3. The MEMS switch device according to claim 1, wherein the protruding structure protrudes from the membrane bridge body structure in a direction perpendicular and close to the first side surface of the base substrate, and a side surface of the protruding structure facing away from the base substrate is not in a same horizontal plane as a side surface of the membrane bridge body structure facing away from the base substrate.

4. The MEMS switch device according to claim 1, wherein one protruding structure is provided.

5. The MEMS switch device according to claim 4, wherein the membrane bridge body structure comprises a first membrane bridge body structure and a second membrane bridge body structure sequentially arranged in a direction parallel to the first side surface of the base substrate;

the protruding structure is correspondingly disposed between the first membrane bridge body structure and the second membrane bridge body structure, with one end of the protruding structure connected to the first membrane bridge body structure and the other end of the protruding structure connected to the second membrane bridge body structure.

6. The MEMS switch device according to claim 1, wherein at least two protruding structures are provided and arranged at intervals, and the membrane bridge body structure and the protruding structures are sequentially and alternately arranged.

7. The MEMS switch device according to claim 6, wherein a plurality of protruding structures are provided and arranged at equal intervals.

8. The MEMS switch device according to claim 6, wherein two protruding structures are provided, the membrane bridge body structure comprises a first membrane bridge body structure, a second membrane bridge body structure, and a third membrane bridge body structure sequentially arranged in a direction parallel to the first side surface of the base substrate; and one of the two protruding structures is correspondingly disposed between the first membrane bridge body structure and the second membrane bridge body structure, while the other of the two protruding structures is correspondingly disposed between the second membrane bridge body structure and the third membrane bridge body structure.

9. The MEMS switch device according to claim 1, wherein an orthographic projection of the protruding structure on the base substrate has any one or combination of a rectangular shape, a circular shape, a cross shape, or an irregular shape.

10. The MEMS switch device according to claim 1, wherein a ratio of a thickness of the protruding structure to a thickness of the membrane bridge body structure ranges from 0.5 to 1000.

11. The MEMS switch device according to claim 1, wherein a ratio of a length of the protruding structure to an overall length of the membrane bridge structure ranges from 0.5% to 50%.

12. The MEMS switch device according to claim 1, wherein the protruding structure has a thickness in a range of 200 nm to 500 nm.

13. The MEMS switch device according to claim 1, wherein the protruding structure has a length in a range of 15 μm to 40 μm.

14. The MEMS switch device according to claim 6, wherein a distance between any two adjacent protruding structures ranges from 30 μm to 40 μm.

15. The MEMS switch device according to claim 1, wherein at least one of the first end or the second end of the membrane bridge structure is provided as a hollowed-out structure.

16. The MEMS switch device according to claim 1, wherein an orthographic projection of the hollowed-out structure on the base substrate has a concave or serpentine shape.

17. The MEMS switch device according to claim 1, wherein the membrane bridge body structure is integrally formed with the protruding structure.

18. An electronic apparatus, comprising the MEMS switch device according to claim 1.

19. The MEMS switch device according to claim 1, wherein a plurality of membrane bridge body structures are provided and sequentially arranged in a direction parallel to the first side surface of the base substrate;

wherein the protruding structure is disposed between any two adjacent membrane bridge body structures of the plurality of membrane bridge body structures, and the two adjacent membrane bridge body structures are connected by the protruding structure.

20. The MEMS switch device according to claim 1, wherein a plurality of protruding structures are provided, wherein one protruding structure of the plurality of protruding structures is disposed between any two adjacent membrane bridge body structures of the plurality of membrane bridge body structures, and the two adjacent membrane bridge body structures are connected by the one protruding structure of the plurality of protruding structures.

* * * * *